United States Patent
Tomokage et al.

(10) Patent No.: US 10,349,546 B2
(45) Date of Patent: Jul. 9, 2019

(54) DRIVE CIRCUIT UNIT

(71) Applicants: HONDA MOTOR CO., LTD., Minato-ku, Tokyo (JP); Mitsubishi Electric Corporation, Chiyoda-ku, Tokyo (JP)

(72) Inventors: Ryoji Tomokage, Wako (JP); Yasuhiro Ozuchi, Wako (JP); Masahiro Shimada, Wako (JP); Seiichi Goto, Wako (JP); Naoki Honishi, Tokyo (JP); Takashi Omura, Tokyo (JP)

(73) Assignees: HONDA MOTOR CO., LTD., Tokyo (JP); Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/030,922

(22) Filed: Jul. 10, 2018

(65) Prior Publication Data
US 2019/0021181 A1    Jan. 17, 2019

(30) Foreign Application Priority Data
Jul. 13, 2017 (JP) .................... 2017-137276

(51) Int. Cl.
| | |
|---|---|
| H05K 5/06 | (2006.01) |
| H02K 5/10 | (2006.01) |
| H05K 5/02 | (2006.01) |
| H05K 5/03 | (2006.01) |
| H02K 11/33 | (2016.01) |
| H05K 7/20 | (2006.01) |
| H02P 27/06 | (2006.01) |

(Continued)

(52) U.S. Cl.
CPC .............. *H05K 5/069* (2013.01); *H02K 5/10* (2013.01); *H02K 11/33* (2016.01); *H05K 5/0247* (2013.01); *H05K 5/03* (2013.01); *B60K 6/405* (2013.01); *B60K 6/42* (2013.01); *B60Y 2200/92* (2013.01); *H02P 27/06* (2013.01); *H05K 7/209* (2013.01); *H05K 7/20854* (2013.01)

(58) Field of Classification Search
CPC ........ H05K 5/069; H05K 5/03; H05K 5/0247; H05K 7/209; H05K 7/20854; H02K 11/33; H02K 5/10; B60K 6/405; B60K 6/42; H02P 27/06; B60Y 2200/92
See application file for complete search history.

(56) References Cited

U.S. PATENT DOCUMENTS 5,540,450 A * 7/1996 Hayashi ............. H01R 13/5205
174/152 G
6,241,554 B1 * 6/2001 Murakami ........... H01R 13/506
439/587

(Continued)

FOREIGN PATENT DOCUMENTS

JP    2013-034343    2/2013

*Primary Examiner* — Abhishek M Rathod
(74) *Attorney, Agent, or Firm* — Amin, Turocy & Watson LLP

(57) ABSTRACT

In a drive circuit unit, a seal member includes a first contact part that makes contact with respect to an inner surface of a case wall section which defines a through hole. In a state in which the seal member is arranged inside the through hole, a first distance in an insertion direction of the seal member from an outside end portion of the inner surface to the first contact part is longer than a second distance in the insertion direction between an outside surface of the seal member and a cover.

6 Claims, 6 Drawing Sheets

(51) Int. Cl.
*B60K 6/42* (2007.10)
*B60K 6/405* (2007.10)

(56) References Cited

U.S. PATENT DOCUMENTS

| | | | | |
|---|---|---|---|---|
| 8,575,499 | B2 * | 11/2013 | Hayashi | H05K 1/118 |
| | | | | 174/539 |
| 9,391,485 | B2 * | 7/2016 | Kobayashi | H01R 9/24 |
| 9,844,157 | B1 * | 12/2017 | Spencer | H05K 5/0217 |
| 2014/0062399 | A1 * | 3/2014 | Moon | B60L 11/1816 |
| | | | | 320/109 |
| 2014/0218877 | A1 * | 8/2014 | Wei | H04B 1/3816 |
| | | | | 361/752 |
| 2015/0189775 | A1 * | 7/2015 | Kanchiku | H01R 13/405 |
| | | | | 361/807 |
| 2018/0213658 | A1 * | 7/2018 | Nuriya | H05K 5/0052 |
| 2018/0235096 | A1 * | 8/2018 | Shindo | G06F 1/16 |

* cited by examiner

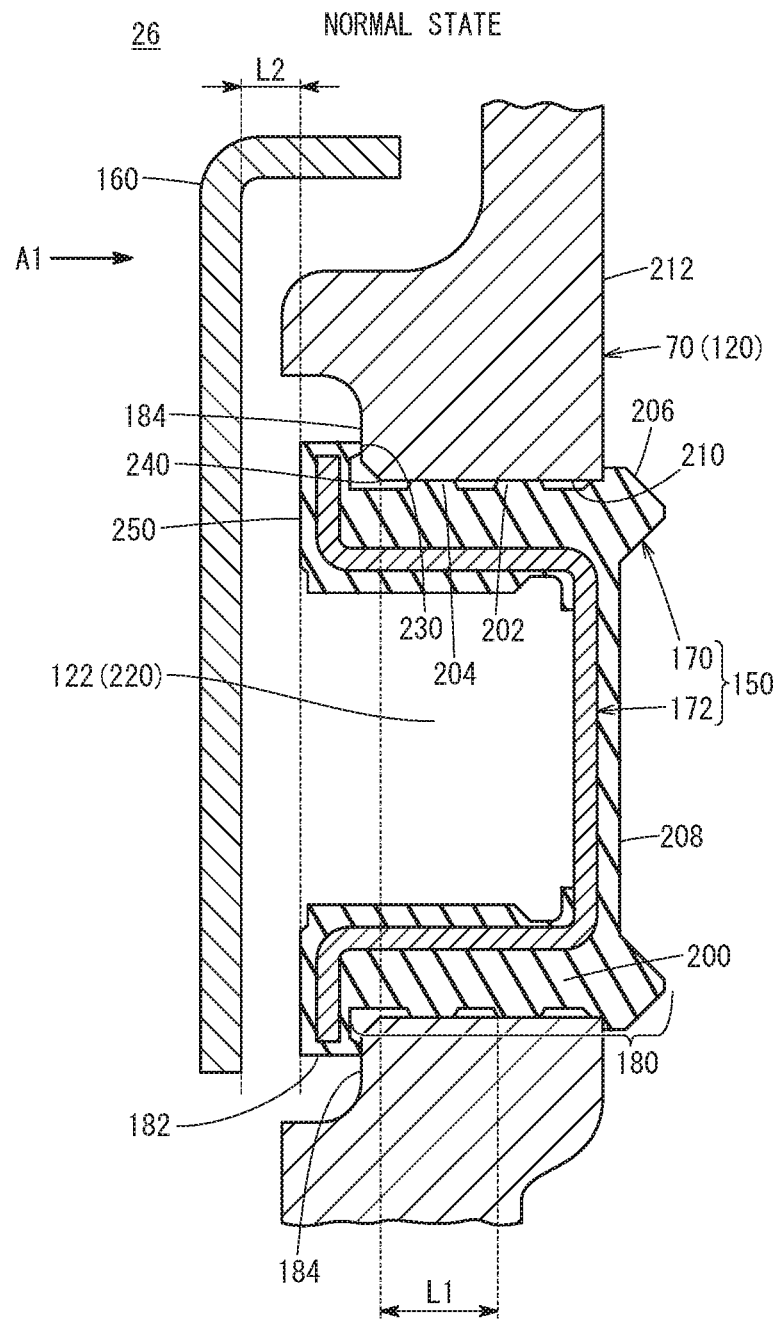

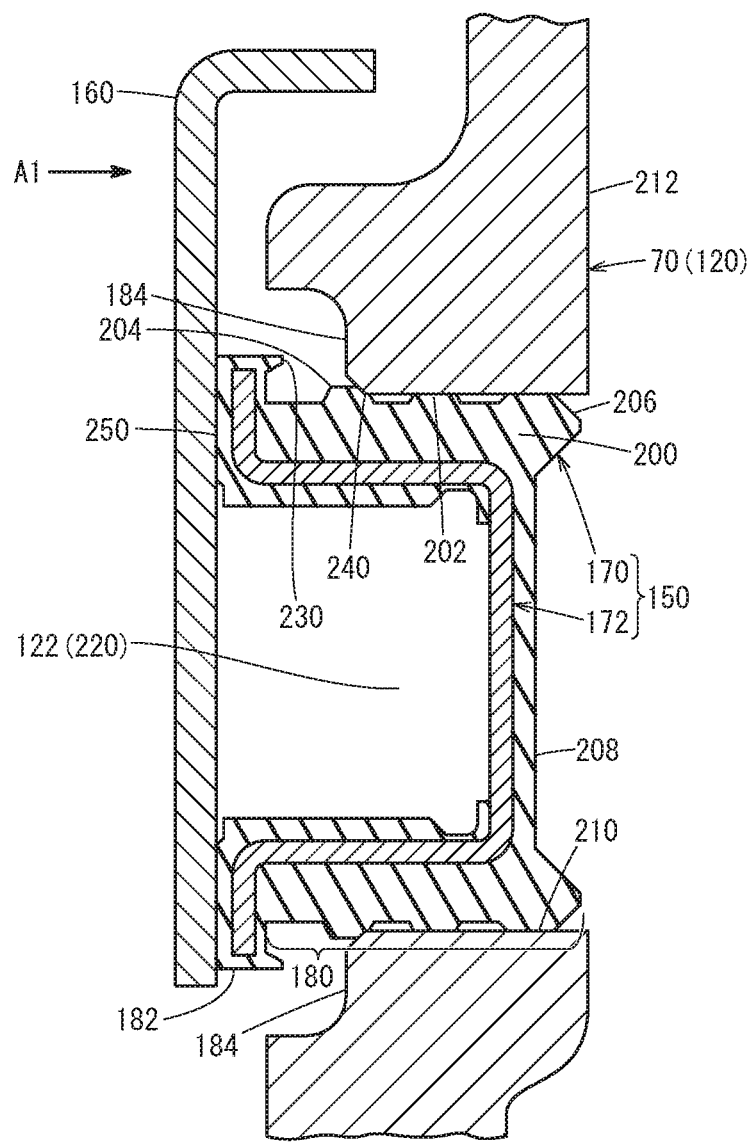

DRIVE CIRCUIT UNIT

CROSS-REFERENCE TO RELATED APPLICATION

This application is based upon and claims the benefit of priority from Japanese Patent Application No. 2017-137276 filed on Jul. 13, 2017, the contents of which are incorporated herein by reference.

BACKGROUND OF THE INVENTION

Field of the Invention

The present invention relates to a drive circuit unit equipped with a drive circuit that converts or adjusts an electric power from a power source, and supplies the converted or adjusted electric power to a motor.

Description of the Related Art

Japanese Laid-Open Patent Publication No. 2013-034343 has an object of providing a power conversion device, which enables an operation of removing a cover to be easily performed, while making it less likely for scratches to occur on a storage case (paragraph [0008], abstract). The storage case accommodates a plurality of electronic components that constitute the power conversion circuit (paragraph [0002]). Further, the cover is attached to a through hole of the storage case, which is formed in the vicinity of a fastening site where electrode terminals of the electronic components are fastened by fastening members (paragraph [0003]).

In order to achieve the aforementioned object, the power conversion device 1 of Japanese Laid-Open Patent Publication No. 2013-034343 (abstract) is equipped with a device main body portion 10 and a storage case 2. A through hole 20 is formed to penetrate through a wall of the storage case 2. The through hole 20 is covered with a resin cover 3. The cover 3 comprises a bonded portion 30, a pair of thin-walled sections 31, and a thick-walled section 32. The bonded portion 30 is bonded by an adhesive 23 to an outer surface of the case at an open peripheral portion of the through hole 20. The pair of thin-walled sections 31 are formed inside the bonded portion 30. The thin-walled sections 31 are thinner than the bonded portion 30. The thick-walled section 32 is formed adjacent to the thin-walled sections 31. The thick-walled section 32 is thicker than the thin-walled sections 31.

With the above-described configuration, it is explained that the cover 3 can easily be removed. More specifically, according to FIGS. 7 to 9 and paragraph [0038] of Japanese Laid-Open Patent Publication No. 2013-034343, it is possible to pierce the thin-walled sections 31 using a pair of claw-shaped jigs 4 and thereby retain the thick-walled section 32. Next, by pulling up the jigs 4 toward the outside of the case, the bonded portion 30 can be separated away from the storage case 2, and the cover 3 can be removed from the storage case 2. When carried out in this manner, since the thick-walled section 32 can be firmly held by the jigs 4, the cover 3 can be peeled off with a strong force. Therefore, it is possible to easily perform the operation of removing the cover 3.

Further, in Japanese Laid-Open Patent Publication No. 2013-034343 (see paragraphs [0026], [0027] and FIG. 3), it is disclosed that a fixing claw 36 for fixing the cover 3 to the storage case 2 is provided on the cover 3.

SUMMARY OF THE INVENTION

As described above, in Japanese Laid-Open Patent Publication No. 2013-034343, a configuration (the bonded portion 30, the thin-walled sections 31, the thick-walled section 32, etc.) is disclosed for facilitating removal of the cover 3. Further, in Japanese Laid-Open Patent Publication No. 2013-034343, it is disclosed that an adhesive 23 is applied to the bonded portion 30, and the fixing claw 36 is used in order to fix the cover 3 to the storage case 2 (see abstract, FIG. 3, etc.). However, according to the technique disclosed in Japanese Laid-Open Patent Publication No. 2013-034343, there is still room for improvement, from the standpoint of preventing the cover 3 (seal member) from slipping out of position, or securing airtightness of the storage case 2 (case).

The present invention has been devised taking into consideration the aforementioned problems, and has the object of providing a drive circuit unit, which can offer an improvement in terms of preventing seal members from slipping out of position, or securing airtightness of a case.

A drive circuit unit according to the present invention includes:

a drive circuit configured to convert or adjust electric power from a power source and supply the converted or adjusted electric power to a motor;

a case in which the drive circuit is accommodated, the case having a case wall section in which a through hole is formed;

a seal member configured to seal the through hole; and a cover configured to overlap, on a more outer side than the seal member, with at least a portion of the seal member in an insertion direction of the seal member;

wherein the seal member includes a first contact part configured to make contact with respect to an inner surface of a case wall section, the inner surface defining the through hole; and in a state in which the seal member is arranged inside the through hole, a first distance in the insertion direction from an outside end portion of the inner surface to the first contact part is longer than a second distance in the insertion direction between an outside surface of the seal member and the cover.

According to the present invention, in a state in which the seal member is arranged inside the through hole, the first distance in the insertion direction of the seal member from the outside end portion of the inner surface of the case wall section to the first contact part of the seal member is longer than the second distance in the insertion direction between the outside surface of the seal member and the cover. In accordance with this feature, even in the case that the seal member is pressed out toward the outside due to a rise of the pressure in the interior of the case accompanying a rise in the temperature in the interior of the case, owing to the cover, it is possible to prevent the seal member from coming out. In addition, in the event that the seal member is pressed toward the outside and the seal member comes into contact with the cover, contact between the first contact part of the seal member and the inner surface of the case wall section is maintained. Therefore, it is possible to ensure airtightness of the case by the seal member.

The seal member may further include a second contact part configured to make contact with respect to the inner surface of the case wall section. In accordance with this feature, in a state in which the seal member is arranged inside the through hole, both the first contact part and the second contact part are placed in contact with the inner surface of the case wall section. Accordingly, airtightness of the case can be more reliably maintained.

The seal member may include an insert part configured to be inserted into the through hole of the case wall section, and a flange configured to make contact with the outside surface of the case wall section. Further, the insert part may include an insert base portion having a contour smaller than that of the through hole, and the first contact part and the second contact part, which project from the insert base portion and have a contour larger than that of the through hole.

In accordance with this feature, the insert base portion having a contour smaller than that of the through hole is disposed between the first contact part and the second contact part. Accordingly, the respective contact parts (the first contact part and the second contact part) are more easily deformed in comparison with a case in which the insert part as a whole makes up a contact part, and therefore, the seal member can easily be inserted into the through hole. In addition, stresses from the inner surface of the case wall section can be more easily concentrated on the first contact part and the second contact part, in comparison with the case in which the insert part as a whole makes up the contact part. Therefore, the airtightness of the case can be enhanced.

The seal member may further include a third contact part configured to make contact with an inside surface of the case wall section, in a state in which the seal member is arranged inside the through hole. In accordance with this feature, even in the case that the pressure in the interior of the case rises accompanying a rise in the temperature in the interior of the case, the third contact part becomes caught on the inside surface of the case wall section, whereby it is easy to prevent the seal member from coming out.

The seal member may include a force receiving surface configured to receive a pressing force of an interior portion of the case, on a more inner side of the case than the through hole. In accordance with this feature, it is possible for a pressing force directed toward the through hole to be received on the inner side of the case, rather than on the case wall section. Consequently, by avoiding a concentration of the pressing force (pressure) inside the case on the through hole, it is possible to further enhance the airtightness of the case.

The flange of the seal member may include an outer circumferential projection that projects toward the outside surface of the case wall section in the insertion direction of the seal member, and makes contact with the outside surface. In accordance with this feature, the seal member is prevented from being pushed excessively into the through hole, and positioning of the seal member in the insertion direction can be facilitated.

The through hole of the case wall section and the seal member may be disposed one for each one terminal of the drive circuit. Further, the cover may be arranged across a plurality of the through holes and a plurality of the seal members.

In accordance with this feature, in a state in which the cover and the seal members are not attached, it is possible to visually confirm the state of the terminals of the drive circuit, and to connect the terminals to other terminals, and the like. Further, the cover is arranged across the plurality of the through holes and the plurality of the seal members. Stated otherwise, the plurality of the through holes and the plurality of the seal members are covered by one cover. Consequently, it is possible to simplify the configuration, as compared with a case in which covers are provided one for each combination of one through hole and one seal member.

According to the present invention, an improvement can be offered in terms of preventing the seal member from slipping out of position, or securing airtightness of the case.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 5 is a cross-sectional view showing a state (normal state) in which a seal member according to the embodiment of the present invention is inserted at a normal position; and FIG. 6 is a cross-sectional view showing a state in which the seal member according to the embodiment of the present invention is displaced by a rise in pressure in the interior of the upper case.

DESCRIPTION OF THE PREFERRED EMBODIMENTS

A. Embodiment

A-1. Configuration

[A-1-1. Overall Configuration]

Figure 1:
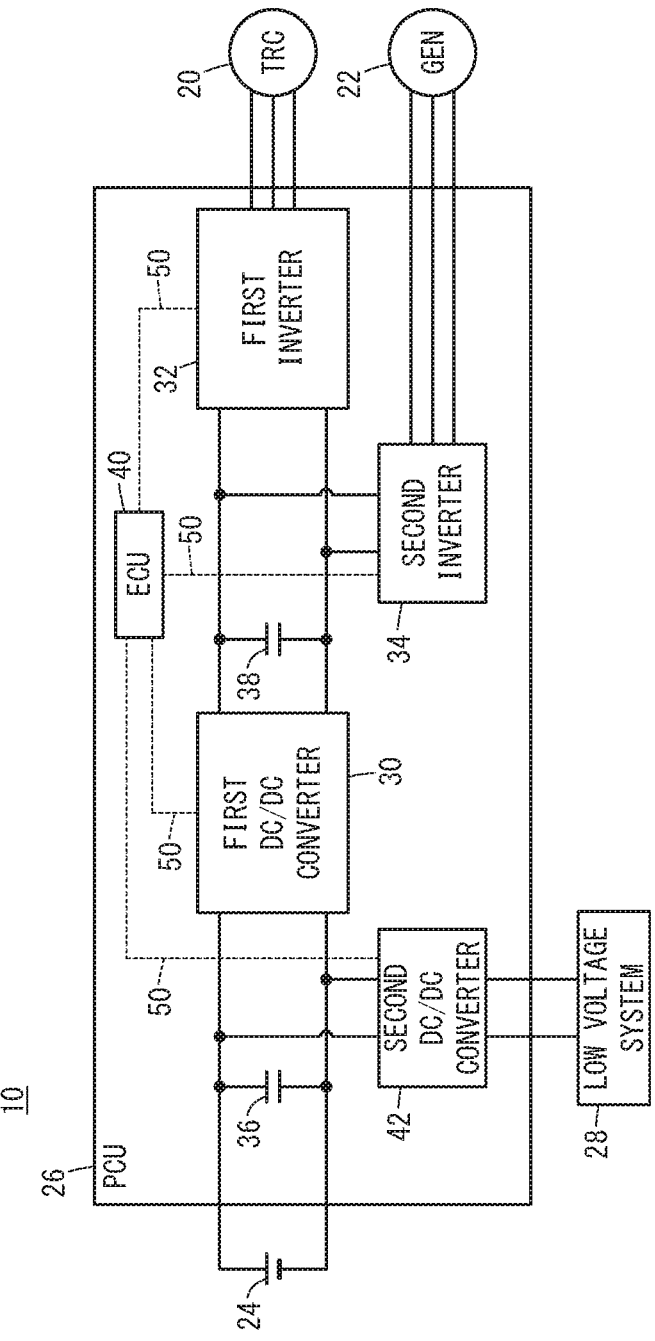
FIG. 1 is an electric circuit diagram showing a schematic configuration of a vehicle including a power control unit (hereinafter referred to as a "PCU") as a drive circuit unit according to an embodiment of the present invention.

FIG. 1 is an electric circuit diagram showing a schematic configuration of a vehicle 10 including a power control unit 26 (hereinafter referred to as a "PCU 26") as a drive circuit unit according to an embodiment of the present invention. The vehicle 10 includes, in addition to the PCU 26, a traction motor 20, a generator 22, a high voltage battery 24 (hereinafter also referred to as a "battery 24" or a "BAT 24"), and a low voltage system 28. The vehicle 10 is a hybrid vehicle and includes an engine serving as a traveling drive source in addition to the traction motor 20. As will be discussed later, the vehicle 10 may be another type of vehicle. The generator 22 generates electric power on the basis of a driving force of the engine. The generator 22 may also be used as the traveling drive source.

[A-1-2. Traction Motor 20]

The traction motor 20 is a three-phase alternating current (AC) brushless type motor, and serves as a drive source for driving the vehicle 10, and which generates motive power Ftrc and supplies the motive power to non-illustrated vehicle wheels (driving wheels). More specifically, the traction motor 20 is driven by one or both of electric power Pbat from a high voltage battery 24 and electric power Pgen from the generator 22. Further, the traction motor 20 carries out regeneration during braking of the vehicle 10, and supplies regenerative electric power Preg to the battery 24. The regenerative electric power Preg may also be supplied to a low voltage system 28.

Hereinafter, the traction motor 20 may also be referred to as a TRC motor 20 or simply a motor 20. The TRC motor 20 may function as a generator in addition to or instead of functioning as a traction motor. Hereinafter, "TRC" or "trc"

or "t" is appended to parameters related to the traction motor 20. Further, in FIG. 1, the traction motor 20 is indicated by "TRC".

[A-1-3. Generator 22]

The generator 22 is a three-phase alternating current brushless type generator, and generates electric power by the motive power Feng from the engine. The electric power Pgen generated by the generator 22 is supplied to the battery 24 or the traction motor 20, or is supplied to the low voltage system 28.

Hereinafter, the generator 22 may also be referred to as a GEN 22. The GEN 22, in addition to or instead of functioning as a generator, may also function as a traction motor. Hereinafter, "GEN" or "gen" or "g" is appended to parameters related to the generator 22. Further, in FIG. 1, the generator 22 is indicated by "GEN". The generator 22 can be used as a starter motor for the engine.

[A-1-4. High Voltage Battery 24]

The high voltage battery 24 is a power storage device (energy storage) including a plurality of battery cells, and is capable of outputting high voltage (several hundreds of volts). For example, a lithium ion secondary battery, a nickel hydrogen secondary battery, or the like, can be used for the high voltage battery 24. Instead of or in addition to the battery 24, it is also possible to use a power storage device such as a capacitor.

[A-1-5. PCU 26]

(A-1-5-1. Outline of PCU 26)

The PCU 26 converts or adjusts the electric power from the battery 24 and/or the generator 22, and supplies the converted or adjusted electric power to the traction motor 20. Further, the PCU 26 converts or adjusts the generated electric power Pgen of the generator 22 and the regenerative electric power Preg of the traction motor 20, and uses the converted or adjusted electric power to charge the battery 24.

As shown in FIG. 1, the PCU 26 includes a first DC/DC converter 30, a first inverter 32, a second inverter 34, a first capacitor 36, a second capacitor 38, an electronic control unit 40 (hereinafter referred to as an "ECU 40"), and a second DC/DC converter 42.

(A-1-5-2. First DC/DC Converter 30)

The first DC/DC converter 30 (hereinafter also referred to as a "converter 30") is a step-up/step-down type converter. The converter 30 steps up the output voltage Vbat (hereinafter also referred to as a "battery voltage Vbat") of the battery 24, and outputs the stepped-up voltage to the TRC motor 20. Further, the converter 30 steps down the output voltage Vgen (hereinafter also referred to as a "GEN voltage Vgen") of the generator 22 or the output voltage Vreg (hereinafter also referred to as a "regenerative voltage Vreg") of the traction motor 20, and supplies the stepped-down voltage to the battery 24.

(A-1-5-3. First Inverter 32)

The first inverter 32 converts the DC current from the battery 24 into an AC current, and supplies the AC current to the traction motor 20. Further, the first inverter 32 converts the AC current from the traction motor 20 into a DC current, and supplies the DC current to the battery 24.

(A-1-5-4. Second Inverter 34)

The second inverter 34 converts the AC current from the generator 22 into a DC current, and supplies the DC current to the battery 24 and/or the traction motor 20. Further, in the case that the generator 22 is used as a traveling drive source, the second inverter 34 converts the DC current from the battery 24 into an AC current, and supplies the AC current to the generator 22.

(A-1-5-5. First Capacitor 36 and Second Capacitor 38)

The first capacitor 36 and the second capacitor 38 function as smoothing capacitors.

(A-1-5-6. Second DC/DC Converter 42)

The second DC/DC converter 42 steps down the battery voltage Vbat or the like, and outputs the stepped-down voltage to the low voltage system 28.

(A-1-5-7. ECU 40)

The ECU 40 is a control circuit (or a control device) that controls the respective components of the PCU 26, and has an input/output unit, a computation unit, and a storage unit, none of which are shown. The input/output unit inputs signals to and outputs signals from the respective components of the vehicle 10 via signal lines 50 (communication lines). It should be noted that, in FIG. 1, the signal lines 50 are shown in a simplified manner. The input/output unit includes a non-illustrated A/D conversion circuit for converting input analog signals into digital signals.

[A-1-6. Low Voltage System 28]

The low voltage system 28 is a power system that handles low voltage (for example, 12 V). The low voltage system 28 includes, for example, a low voltage battery, a navigation device, a headlight (none of which are shown), the ECU 40, and the like.

A-2. Specific Configuration and Arrangement of PCU 26

[A-2-1. Overview]

Figure 2:
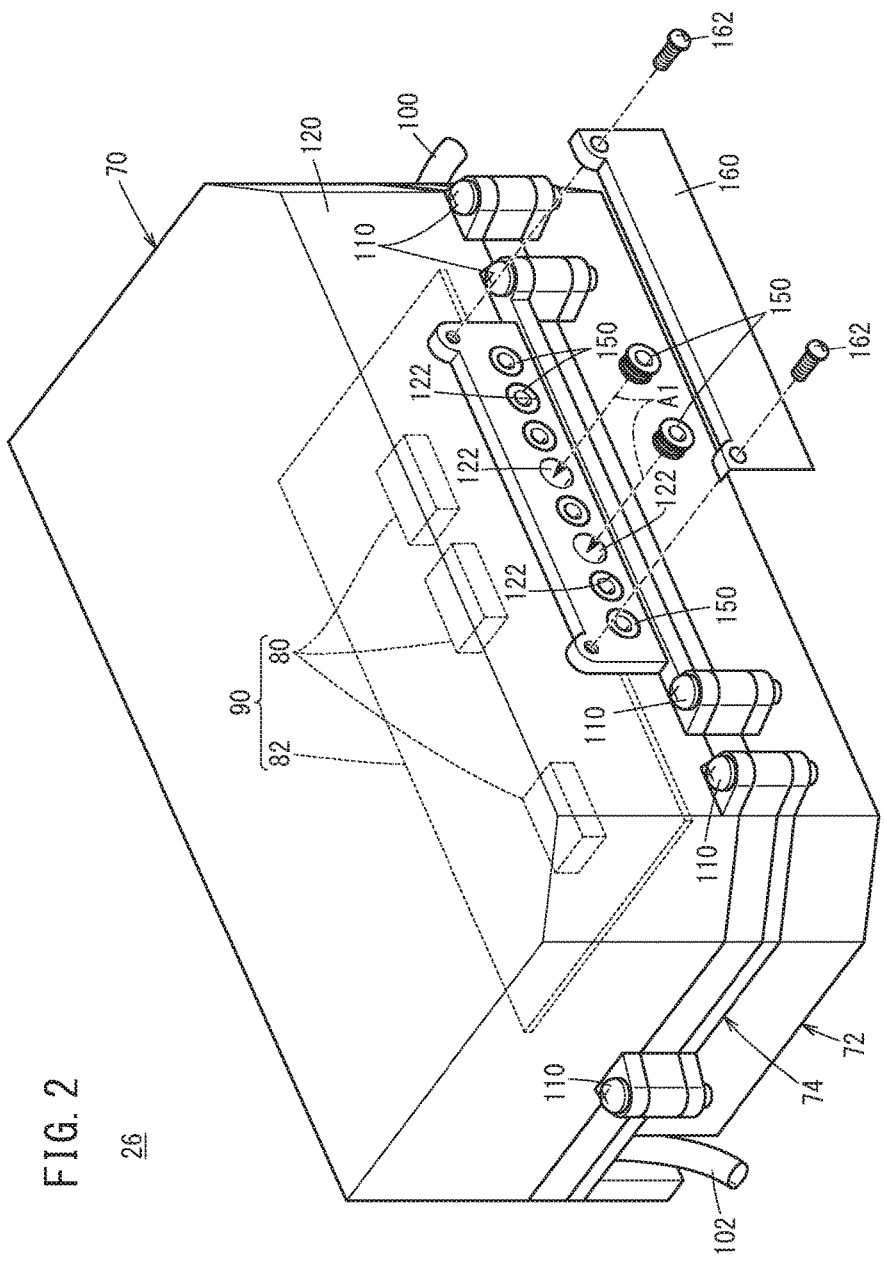
FIG. 2 is a perspective view showing the PCU according to the embodiment of the present invention, with a portion thereof being disassembled.
Figure 3:
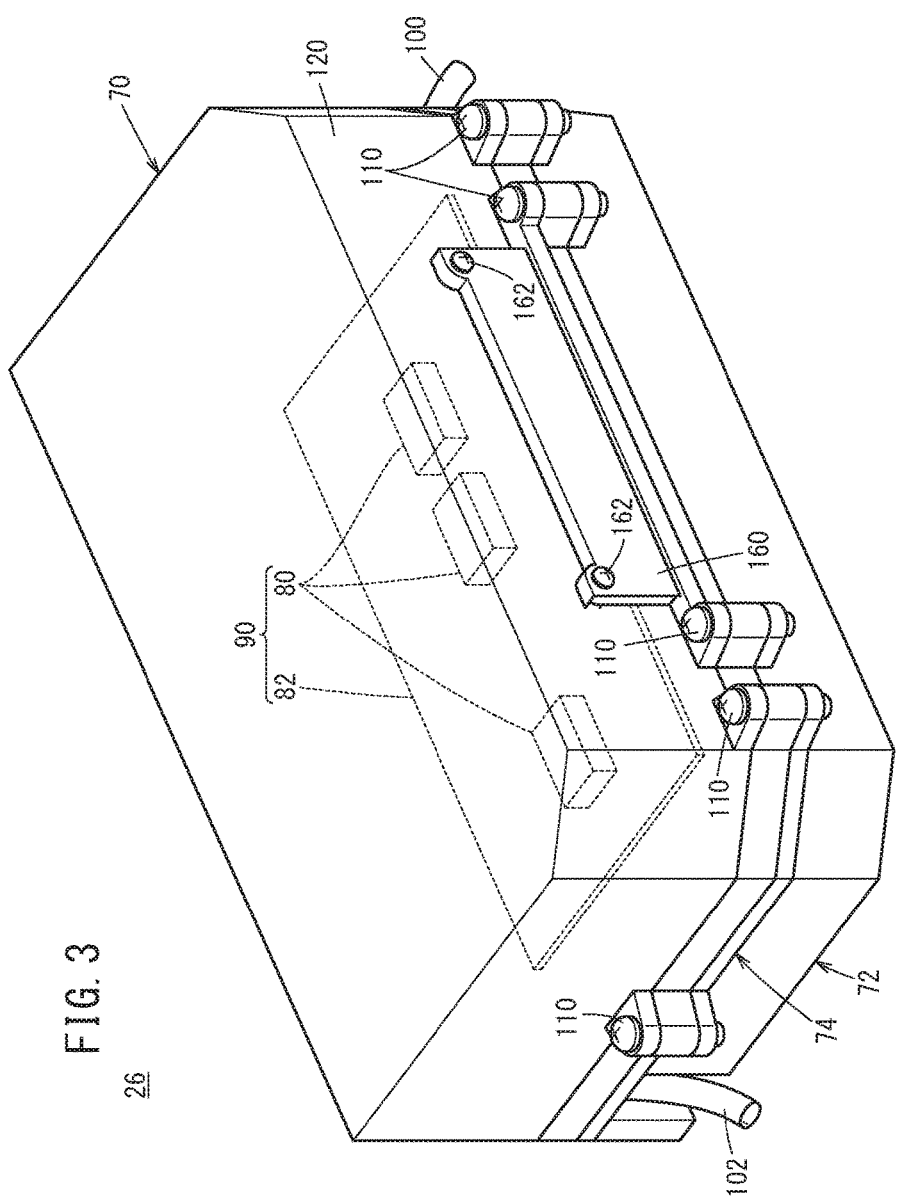
FIG. 3 is a perspective view showing an external appearance of the PCU according to the embodiment of the present invention.

FIG. 2 is a perspective view showing the PCU 26 of the present embodiment, with a portion thereof being disassembled. FIG. 3 is a perspective view showing an external appearance of the PCU 26 of the present embodiment. As shown in FIGS. 2 and 3, the PCU 26 includes an upper case 70, a lower case 72, and a heat sink 74. All of the upper case 70, the lower case 72, and the heat sink 74 are made of metal (for example, made of aluminum).

In the interior of the upper case 70 and the lower case 72, circuit components 80 are arranged, such as the first DC/DC converter 30, the first inverter 32, the second inverter 34, the first capacitor 36, the second capacitor 38, the ECU 40, and the second DC/DC converter 42. For example, in the upper case 70, the circuit components 80 are arranged on a circuit board 82 and the periphery thereof. A similar circuit board (not shown) is also provided in the lower case 72, and circuit components 80 are connected thereto.

Hereinafter, the circuit components 80 and the circuit board 82 are referred to collectively as a drive circuit 90. The drive circuit 90 converts or adjusts the electric power from the battery 24, and supplies the converted or adjusted electric power to the motor 20. In addition, the drive circuit 90 supplies electric power from the generator 22 and the motor 20 to the battery 24 and the second DC/DC converter 42. The upper case 70 and the lower case 72 accommodate the drive circuit 90.

The heat sink 74 is a plate-shaped member that cools the first DC/DC converter 30, the first inverter 32, the second inverter 34, and the like, which act as heating elements. A coolant is supplied from a non-illustrated coolant pump to an introduction side pipe 100 of the heat sink 74. After the coolant has moved inside the heat sink 74, the coolant is discharged from a discharge side pipe 102. The coolant that is discharged from the discharge side pipe 102 releases heat through a non-illustrated radiator, and then, the coolant is supplied again to the introduction side pipe 100.

As can be understood from FIGS. 2 and 3, the upper case 70, the lower case 72, and the heat sink 74 are connected or fixed to each other by the first screws 110. Further, the upper case 70, the lower case 72, and the heat sink 74 (and more specifically, the PCU 26), which are connected or fixed by the first screws 110, are further connected or fixed by non-illustrated bolts to a motor housing (not shown). The motor housing accommodates the traction motor 20 and the generator 22.

[A-2-2. Upper Case 70 and the Periphery Thereof]

Figure 4:
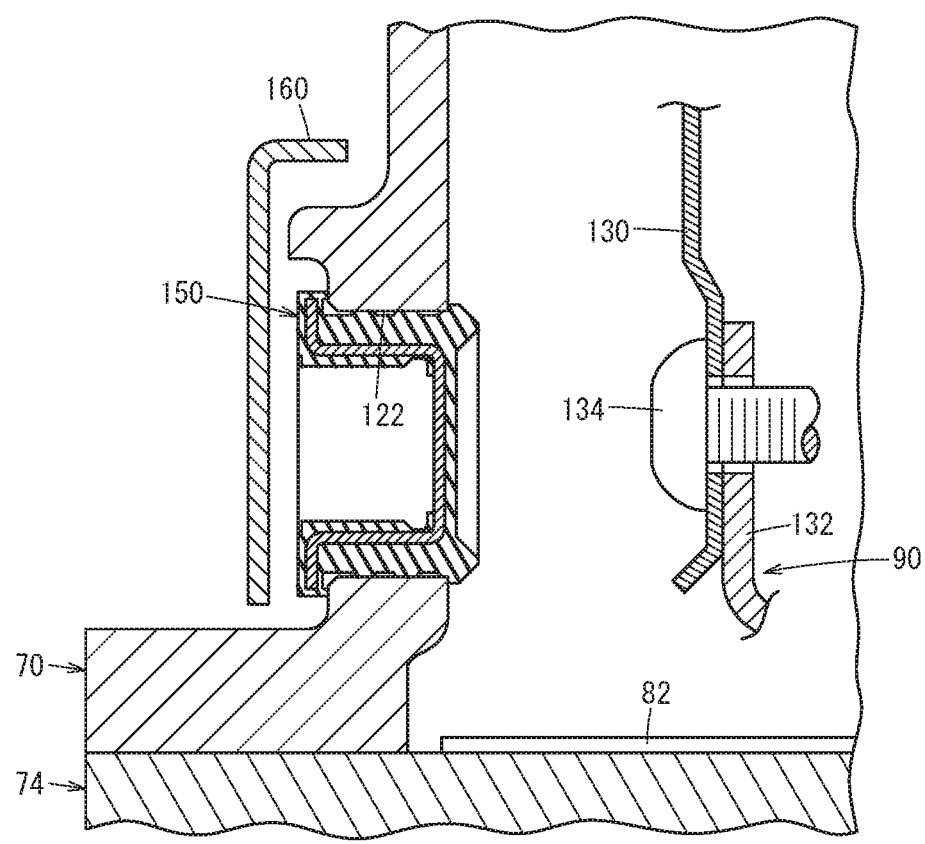
FIG. 4 is a cross-sectional view showing an upper case and a portion of the periphery thereof according to the embodiment of the present invention.

FIG. 4 is a cross-sectional view showing the upper case 70 of the present embodiment and a portion of the periphery thereof. As shown in FIG. 2, a plurality of through holes 122 are formed in a wall section 120 (hereinafter also referred to as a "case wall section 120") of the upper case 70. The through holes 122 are arranged in front of terminals 130 of the circuit components 80 such as the first DC/DC converter 30, the first inverter 32, the second inverter 34, and the like. Consequently, the terminals 130 of the circuit components 80 can be connected to terminals 132 (see FIG. 4) provided on the side of the circuit board 82. According to the present embodiment, connection between the terminals 130, 132 is made by second screws 134. Alternatively, connection between the terminals 130, 132 may be made as shown in FIG. 3 of Japanese Laid-Open Patent Publication No. 2013-034343.

As shown in FIGS. 2 and 4, a seal member 150 is inserted into each of the through holes 122. The through holes 122 are sealed by the seal members 150. Further, in a state in which the seal members 150 are inserted into the respective through holes 122, a cover 160 is attached via third screws 162 to the upper case 70.

An inside/outside air pressure control valve (check valve) (not shown) for the upper case 70 may be provided in the upper case 70, and in the case that the pressure inside the upper case 70 rises, the pressure may be released to the outside. The same applies to the lower case 72.

[A-2-3. Seal Members 150]

(A-2-3-1. Constituent Components of the Seal Members 150)

FIG. 5 is a cross-sectional view showing a state (normal state) in which the seal members 150 of the present embodiment are inserted in a normal position. FIG. 6 is a cross-sectional view showing a state in which the seal members 150 of the present embodiment are displaced by a rise in pressure in the interior of the upper case 70.

As shown in FIG. 5, etc., each of the seal members 150 includes a resin member 170 and a core member 172. The resin member 170 is a rubber cap. The core member 172 is a metal member which is disposed inside the resin member 170. The core member 172 increases the rigidity of the resin member 170.

(A-2-3-2. Respective Parts of the Seal Members 150)

(A-2-3-2-1. Outline)

As shown in FIG. 5, each of the seal members 150 includes an insert part 180 which is adapted to be inserted into the through hole 122 of the case wall section 120, and a flange 182 that contacts an outside surface 184 of the case wall section 120.

(A-2-3-2-2. Insert Parts 180)

Each of the insert parts 180 includes an insert base portion 200, a first contact part 202, a second contact part 204, a third contact part 206, and a force receiving surface 208. The insert base portion 200 has a smaller diameter (contour) than that of the through hole 122. The first contact part 202 is disposed in the upper case 70 on a more inner side (the right side in FIG. 5) than the second contact part 204. As shown in FIGS. 5 and 6, the first contact part 202 and the second contact part 204 are substantially trapezoidal in cross section along the axial direction, and are placed in contact with respect to an inner surface 210 of the case wall section 120 defining the through hole 122.

Although not illustrated in FIGS. 5 and 6, in a state of not being inserted into the upper case 70, the first contact part 202 and the second contact part 204 have a larger diameter (contour) than that of the through hole 122. When the seal members 150 are inserted into the through holes 122, the first contact parts 202 and the second contact parts 204 become deformed by a reaction force from the inner surfaces 210 of the upper case 70.

The third contact part 206 is disposed more on the inner side of the upper case 70 than the first contact part 202. The third contact part 206 contacts an inside surface 212 of the case wall section 120. The inside surface 212 is substantially perpendicular to the inner surfaces 210 defining the through holes 122.

The force receiving surface 208 receives a pressing force from the interior of the upper case 70 on a more inward side of the upper case 70 than the through holes 122.

As shown in FIG. 5, even in the event that the seal members 150 are inserted into the through holes 122, although cavities 220 exist on the inner sides of the insert parts 180, due to the presence of the core members 172, the shape of the seal members 150 can be maintained.

(A-2-3-2-3. Flanges 182)

Each of the flanges 182 of the seal members 150 comprises an outer circumferential projection 230 that projects toward the outside surface 184 of the case wall section 120 in the insertion direction A1 of the seal members 150, and makes contact with the outside surface 184 (see FIG. 5).

[A-2-4. Cover 160]

(A-2-4-1. Outline of Cover 160)

The cover 160 is a member made of metal (for example, made of iron). As can be understood from FIGS. 2 through 6, the cover 160 is arranged on a more outer side than the seal members 150, so as to overlap with the seal members 150 in the insertion direction A1 (the rightward direction in FIG. 5) of the seal members 150. The cover 160 is not limited to being made of metal, and may be made of other materials such as resin or the like.

(A-2-4-2. Operations of the Cover 160)

As described above, the circuit components 80 are disposed inside the upper case 70 (see FIGS. 2 and 3). There is a possibility that the internal pressure P of the upper case 70 may rise excessively, for example, in the case that non-illustrated switching elements included in the circuit components 80 experience an ON failure and an overcurrent is generated or the like. In the case that such an increase in the internal pressure P occurs, it is possible for the internal pressure P to be released by operation of the aforementioned check valve. However, in the case that the check valve does not operate properly for some reason, there is a possibility that the seal members 150, which have a comparatively low pressure resistance (a comparatively low holding force), may be displaced outwardly (in a direction opposite to the insertion direction A1) accompanying the increase in the internal pressure P (see FIG. 6).

As described above, even in the case that the seal members 150 are displaced toward the outside, the cover 160 supports the seal members 150, thereby preventing the seal members 150 from becoming separated from the through holes 122.

As shown in FIG. 5, in a normal state in which the seal members 150 are arranged inside the through holes 122, a first distance L1 in the insertion direction A1 from outside end portions 240 of the inner surfaces 210 to the first contact parts 202 is longer than a second distance L2 in the insertion direction A1 between the outside surfaces 250 of the seal members 150 and the cover 160. Accordingly, even in the case that the seal members 150 are displaced outwardly, the first contact parts 202 can be maintained in contact with the inner surfaces 210 of the case wall section 120.

In FIG. 5, the position (reference position Pref1) of the first contact part 202, which serves as a reference for the first distance L1, is an outermost side of the area where the first contact part 202 is in contact with the inner surface 210. However, the reference position Pref1 for the first contact part 202 may be any other position that is capable of ensuring airtightness between the first contact part 202 and the inner surface 210.

Moreover, in FIG. 6, the second contact part 204 is also in contact with the inner surface 210 of the case wall section 120. However, since the area where the second contact part 204 makes contact is relatively small, it may be considered that the airtightness between the second contact part 204 and the inner surface 210 is insufficient in such an area. Alternatively, the position of the second contact parts 204, and the position of the cover 160, etc., may be changed in a manner so as to ensure airtightness between the second contact parts 204 and the inner surfaces 210 when the seal members 150 and the cover 160 are in contact with each other.

A-3. Effects of the Present Embodiment

According to the present embodiment, in a state (see FIG. 5) in which the seal members 150 are arranged inside the through holes 122, the first distance L1 (a distance in the insertion direction A1 of the seal members 150 from the outside end portions 240 of the inner surfaces 210 of the case wall section 120 to the first contact parts 202) is longer than the second distance L2 (a distance in the insertion direction A1 between the outside surfaces 250 of the seal members 150 and the cover 160). In accordance with this feature, even in the case that the seal members 150 are pressed out toward the outside due to a rise of the internal pressure P inside the case 70 accompanying a rise in the temperature inside the case 70, owing to the cover 160, it is possible to prevent the seal members 150 from coming out (see FIG. 6). In addition, in the event that the seal members 150 are pressed toward the outside and the seal members 150 come into contact with the cover 160, contact between the first contact parts 202 of the seal members 150 and the inner surfaces 210 of the case wall section 120 is maintained. Therefore, it is possible to ensure airtightness of the upper case 70 (case) by the seal members 150.

In the present embodiment, the seal members 150 include the second contact parts 204 that make contact with respect to the inner surfaces 210 of the case wall section 120 (see FIG. 5). In accordance with this feature, in a state in which the seal members 150 are arranged inside the through holes 122 (see FIG. 5), both the first contact parts 202 and the second contact parts 204 are placed in contact with the inner surfaces 210 of the case wall section 120. Accordingly, airtightness of the case 70 can be more reliably maintained.

In the present embodiment, the seal members 150 comprise the insert parts 180 which are adapted to be inserted into the through holes 122 of the case wall section 120, and the flanges 182 that contact the outside surface 184 of the case wall section 120 (see FIG. 5). Further, the insert parts 180 may comprise the insert base portions 200 having a diameter (contour) smaller than that of the through holes 122, and the first contact parts 202 and the second contact parts 204, which project from the insert base portions 200, may have a diameter (contour) larger than that of the through holes 122 (see FIG. 5).

In accordance with this feature, the insert base portions 200 having a diameter smaller than that of the through holes 122 are disposed between the first contact parts 202 and the second contact parts 204. Accordingly, the respective contact parts (the first contact parts 202 and the second contact parts 204) are more easily deformed in comparison with a case in which the insert parts 180 as a whole make up the contact parts, and therefore, the seal members 150 can easily be inserted into the through holes 122. In addition, stresses from the inner surfaces 210 of the case wall section 120 can be more easily concentrated on the first contact parts 202 and the second contact parts 204, in comparison with the case in which the insert parts 180 as a whole make up the contact parts. Therefore, the airtightness of the upper case 70 (case) can be enhanced.

In the present embodiment, the seal members 150 may further include the third contact parts 206 that make contact with the inside surface 212 of the case wall section 120, in a state in which the seal members 150 are arranged inside the through holes 122 (see FIG. 5). In accordance with this feature, even in the case that the internal pressure P inside the case 70 rises accompanying a rise in the temperature inside the case 70, the third contact parts 206 become caught on the inside surface 212 of the case wall section 120, whereby it is easy to prevent the seal members 150 from coming out.

In the present embodiment, the seal members 150 include the force receiving surfaces 208 (see FIG. 5) which are adapted to receive a pressing force of an interior portion of the upper case 70, on a more inner side of the upper case 70 (case) than the through holes 122. In accordance with this feature, it is possible for a pressing force directed toward the through holes 122 to be received on the inner side of the upper case 70, rather than on the case wall section 120. Consequently, by avoiding a concentration of the pressing force (pressure) inside the upper case 70 on the through holes 122, it is possible to further enhance the airtightness of the upper case 70.

In the present embodiment, the flanges 182 of the seal members 150 comprise the outer circumferential projections 230 that project toward the outside surface 184 of the case wall section 120 in the insertion direction A1 of the seal members 150, and make contact with the outside surface 184 (see FIG. 5). In accordance with this feature, the seal members 150 are prevented from being pushed excessively into the through holes 122, and positioning of the seal members 150 in the insertion direction A1 can be facilitated.

In the present embodiment, the through holes 122 of the case wall section 120 and the seal members 150 are disposed one for each one terminal 130 of the drive circuit 90 (see FIGS. 2 and 4). Further, the cover 160 is arranged across the plurality of the through holes 122 and the plurality of the seal members 150 (see FIG. 3). In accordance with this feature, in a state in which the cover 160 and the seal members 150 are not attached, it is possible to visually confirm the state of the terminals 130 of the drive circuit 90, and to connect the terminals 130 to other terminals 132, and the like.

Further, the cover 160 is arranged across the plurality of the through holes 122 and the plurality of the seal members 150. Stated otherwise, the plurality of the through holes 122 and the plurality of the seal members 150 are covered by one cover 160. Consequently, it is possible to simplify the configuration, as compared with a case in which covers 160 are provided one for each combination of one through hole 122 and one seal member 150.

In the present embodiment, each of the seal members 150 includes the resin member 170 and the metal core member 172 disposed inside the resin member 170 (see FIG. 5). Consequently, it is possible to achieve both airtightness and rigidity of the seal members 150.

B. Modifications

It is a matter of course that the present invention is not limited to the above-described embodiment, and various modified or additional configurations could be adopted therein based on the descriptive content of the present specification. For example, the following configurations can be adopted.

B-1. Objects to which the Invention is Applied

The vehicle 10 of the above-described embodiment includes the traction motor 20, the generator 22 (see FIG. 1), and a non-illustrated engine. However, for example, insofar as attention is focused on the seal members 150 and the cover 160, the present invention is not limited to this feature. For example, the vehicle 10 may be configured to include a plurality of traction motors 20 and generators 22.

B-2. Power Source

In the above-described embodiment, the high voltage battery 24 is used as a power source for supplying electric power to the motor 20 via the PCU 26 (see FIG. 1). However, for example, insofar as attention is focused on the seal members 150 and the cover 160, the present invention is not limited to this feature. For example, it is possible to position the generator 22 as the main power source (to use the generator 22 as a so-called range extender).

B-3. PCU 26

[B-3-1. Overall Configuration of PCU 26]

In the above-described embodiment, both the upper case 70 and the lower case 72 are provided (see FIG. 2). However, for example, insofar as attention is focused on the seal members 150 and the cover 160, the present invention is not limited to this feature. For example, one or three or more cases may be provided. Moreover, as situations in which only one case is provided, there may be considered a situation in which the case is fixed directly to a housing (not shown) for the motor 20 (i.e., a case in which the drive circuit 90 is disposed directly on the motor housing), or the like.

In the above-described embodiment, one heat sink 74 is provided through which a coolant is circulated (see FIGS. 2 and 3). However, for example, insofar as attention is focused on the seal members 150 and the cover 160, the present invention is not limited to this feature. For example, it is possible to omit the heat sink 74 or to provide a plurality of heat sinks 74.

[B-3-2. Seal Members 150]

In the above-described embodiment, the cavities 220 exist inside the insert parts 180 (see FIG. 5). However, from the standpoint of sealing the through holes 122 with the seal members 150, the shape of the insert parts 180 is not limited to this feature. For example, it is also possible for a resin material to be arranged at the position of the cavities 220.

In the above-described embodiment, each of the seal members 150 includes the resin member 170 and the core member 172 (see FIG. 5). However, for example, insofar as the displacement of the seal members 150 is regulated by the cover 160, the present invention is not limited to this feature. For example, the seal members 150 may be formed by only the resin member 170. In that case, a resin material may also be provided at the position of the cavity 220 (see FIG. 5).

In the above-described embodiment, the resin member 170 is made of rubber. However, for example, from the standpoint of regulating the displacement of the seal members 150 by the cover 160, the present invention is not limited to this feature, and materials other than rubber may be used.

In the above-described embodiment, the flange 182 is provided on the outermost side of the seal member 150 (see FIG. 5). However, for example, from the standpoint of regulating the displacement of the seal members 150 by the cover 160, the shape of the seal members 150 is not limited to this feature. For example, a portion having a diameter (contour) equivalent to that of the insert part 180 may be disposed on an outer side of the flange 182. Alternatively, it is also possible to use seal members 150 that do not include the flanges 182 (having only the insert parts 180).

In the above-described embodiment, the outer circumferential projections 230 are provided on the flanges 182 of the seal members 150 (see FIG. 5). However, for example, from the standpoint of placing the outside surface 184 of the case wall section 120 in contact with the flanges 182, the present invention is not limited to this feature. For example, the surfaces of the flanges 182 that face toward the outside surface 184 may also be flat.

In the above-described embodiment, each of the seal members 150 includes the first contact part 202, the second contact part 204, and the third contact part 206 (see FIG. 5). However, for example, from the standpoint of ensuring airtightness between the seal members 150 and the inner surfaces 210 of the upper case 70, the present invention is not limited to this feature. For example, it is possible to omit one or both of the second contact part 204 and the third contact part 206.

[B-3-3. Cover 160]

In the above-described embodiment, the cover 160 is disposed on an outer side of the seal members 150 so as to overlap with the entirety of each of the seal members 150 in the insertion direction A1 of the seal members 150 (see FIGS. 3 to 5). However, for example, from the standpoint of regulating the displacement of the seal members 150 by the cover 160, the arrangement of the seal members 150 is not limited to this feature, and the cover 160 may be arranged so as to overlap with at least a portion of each of the seal members 150 in the insertion direction A1.

[B-3-4. Other Considerations]

In the above-described embodiment, one through hole 122 and one seal member 150 are provided in corresponding relation to each one of the terminals 130 (see FIGS. 2 and 4). However, for example, the present invention is not limited to this feature, insofar as the displacement of the seal members 150 is regulated by the cover 160. For example, one through hole 122 and one seal member 150 may be provided corresponding to a plurality (for example, two or three) of the terminals 130. Alternatively, while providing one through hole 122 in relation to each one of the terminals 130, one seal member 150 may be provided in corresponding relation to a plurality (for example, two or three) of the terminals 130 and a plurality of the through holes 122.

Stated otherwise, a plurality of the seal members 150 may be integrated and used together in a unitary manner.

In the above-described embodiment, the through holes 122 of the case wall section 120, the insert parts 180 of the seal members 150, and the flanges 182 are each based on a cylindrical shape with a cross section that approximates a perfect circle (see FIG. 5, etc.). However, from the standpoint of sealing the through holes 122, the present invention is not limited to this feature. For example, each of the through holes 122, the insert parts 180, and the flanges 182 may be based on a cylindrical shape having an elliptical cross section. Alternatively, each of the through holes 122, the insert parts 180, and the flanges 182 may be based on a quadrangular or four-sided tubular shape having a square or rectangular cross section.

What is claimed is:

1. A drive circuit unit comprising:
   a drive circuit configured to convert or adjust electric power from a power source and supply the converted or adjusted electric power to a motor, wherein the drive circuit comprises a plurality of terminals;
   a case in which the drive circuit is accommodated, the case having a case wall section in which a plurality of through holes are formed;
   a plurality seal members, wherein a seal member of the plurality of seal members is configured to seal a through hole of the plurality of through holes; and
   a cover configured to arranged across, on a more outer side of the case wall than the seal member, the plurality of seal members in an insertion direction of the seal members;
   wherein each of the seal members of the plurality of seal members includes a first contact part configured to make contact with respect to an inner surface of the case wall section, the inner surface defining the plurality of through holes; and
   in a state in which the seal member of the plurality of seal members is arranged inside the respective through hole of the plurality of through holes, a first distance in the insertion direction from an outside end portion of the inner surface to the first contact part is longer than a second distance in the insertion direction between an outside surface of the seal member of the plurality of seal members and the cover.

2. The drive circuit unit according to claim 1, wherein the seal member of the plurality of seal members further includes a second contact part configured to make contact with respect to the inner surface of the case wall section.

3. The drive circuit unit according to claim 2, wherein:
   each seal member of the plurality of seal members comprises:
   an insert part configured to be inserted into the through hole of the case wall section; and
   a flange configured to make contact with the outside surface of the case wall section; and
   the insert part comprises:
   an insert base portion having a contour smaller than a contour of the through hole; and
   the first contact part and the second contact part, which project from the insert base portion and have a contour larger than the contour of the through hole.

4. The drive circuit unit according to claim 1, wherein the seal member of the plurality of seal members further includes a third contact part configured to make contact with an inside surface of the case wall section, in a state in which the seal member of the plurality of seal members is arranged inside the through hole.

5. The drive circuit unit according to claim 1, wherein the plurality of seal members includes a force receiving surface configured to receive a pressing force of an interior portion of the case, on a more inner side of the case than the respective through hole of the plurality of through holes.

6. The drive circuit unit according to claim 3, wherein the flange of each of the seal members comprises an outer circumferential projection that projects toward the outside surface of the case wall section in the insertion direction of the seal member, and makes contact with the outside surface.

* * * * *